United States Patent
Ryan

(10) Patent No.: US 12,322,661 B2
(45) Date of Patent: Jun. 3, 2025

(54) SHIFTED VIA-CHAIN ELECTRICAL-TEST MEASUREMENTS FOR HYBRID BONDING ALIGNMENT CORRELATION

(71) Applicant: Tokyo Electron Limited, Tokyo (JP)

(72) Inventor: Kevin Ryan, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 511 days.

(21) Appl. No.: 17/876,176

(22) Filed: Jul. 28, 2022

(65) Prior Publication Data

US 2024/0038599 A1     Feb. 1, 2024

(51) Int. Cl.
*H01L 23/58*      (2006.01)
*H01L 21/66*      (2006.01)
*H01L 23/00*      (2006.01)
*H01L 23/544*     (2006.01)
*H01L 29/10*      (2006.01)

(52) U.S. Cl.
CPC .............. *H01L 22/14* (2013.01); *H01L 22/32* (2013.01); *H01L 23/544* (2013.01); *H01L 24/06* (2013.01); *H01L 24/08* (2013.01); *H01L 24/80* (2013.01); *H01L 2223/54426* (2013.01); *H01L 2224/0612* (2013.01); *H01L 2224/08145* (2013.01); *H01L 2224/80895* (2013.01); *H01L 2224/80896* (2013.01)

(58) Field of Classification Search
CPC ....... H01L 22/14; H01L 22/32; H01L 23/544; H01L 24/06; H01L 24/80; H01L 2223/54426; H01L 2224/0612; H01L 2224/08145; H01L 2224/80895; H01L 24/80896; H01L 25/0657; H01L 2224/32145; H01L 2224/0401; H01L 24/05; H01L 23/49827; H01L 25/0652; H01L 24/13; H01L 21/76802; H01L 2224/73204; H01L 2224/12105; H01L 2225/06517; H01L 2225/1058; H01L 25/0655; H01L 2225/06513; H01L 2225/06541; H01L 24/08; H01L 21/76805; H01L 24/81; H01L 21/486; H01L 23/53295

See application file for complete search history.

(56) References Cited

U.S. PATENT DOCUMENTS 11,279,615 B2 *    3/2022   Lin ................... B81C 1/00238
2017/0125471 A1 *  5/2017   Kim ................... H10F 39/8063

FOREIGN PATENT DOCUMENTS

CN     106920808 A  *  7/2017   ....... H01L 27/14612
CN     118522643 A  *  8/2024   ........ H01L 21/4853

* cited by examiner

*Primary Examiner* — Niki H Nguyen
(74) *Attorney, Agent, or Firm* — Foley & Lardner LLP

(57) ABSTRACT

Semiconductor devices and corresponding methods of manufacturing the same are disclosed. For example, a semiconductor device includes a first semiconductor substrate and a second semiconductor substrate. A first portion of a test structure is disposed over the first substrate and a second portion of the test structure is disposed over the second substrate. The test structure includes intentionally offset portions. The performance characteristics of the intestinally offset portions are measured to detect an alignment of the first portion of the test structure and a second portion of the test structure.

20 Claims, 7 Drawing Sheets

SHIFTED VIA-CHAIN ELECTRICAL-TEST MEASUREMENTS FOR HYBRID BONDING ALIGNMENT CORRELATION

FIELD OF THE DISCLOSURE

This disclosure relates to microelectronic devices including semiconductor devices, transistors, and integrated circuits, including methods of microfabrication.

BACKGROUND

In the manufacture of a semiconductor device, one or more semiconductor substrates can be bonded. For example, a first semiconductor (e.g., silicon) substrate can be stacked over a second semiconductor substrate (e.g., a first memory device can be stacked over a processing device or a second memory device). The semiconductor substrate can be a full wafer or a die derived therefrom. The one or more dies can be separated by a dicing process. The semiconductor substrate can include one or more alignment portions. The alignment of the semiconductor substrates can vary over the surface of the semiconductor substrates. Misalignment of the semiconductor substrate can include misalignment of one or more connection structures disposed therebetween or can be intrinsic to the substrate. Although various techniques for the alignment and detection of alignments of semiconductor substrates of multi-die semiconductor devices are practiced, further improvements in the art are desired.

SUMMARY

The present disclosure relates to systems and methods for electrical test measurements to determine an alignment of a semiconductor device. The systems and methods can include determining a correlation between electrical test measurements with a performance of a semiconductor device or with another alignment mechanism such as alignment marks configured for detection by an infrared sensor (e.g., a wafer scale infrared detector (WIRED)). The test structures can be disposed along corresponding layers of bonded semiconductor substrates, such as wafers or dies thereof. The test structures can be placed adjacent to one or more circuits of interest. The test structures can have a first portion connected to a wafer or other semiconductor substrate (such as by one or more intermediate conductive or dielectric layers), and a second portion connected to another wafer or other semiconductor substrate. The respective wafers or other semiconductor substrates can be connected, such as by a hybrid bonding process. The alignment of the first and second portion of the test structure can be determined subsequent to the bonding of the respective semiconductor substrates (e.g., bonded by connecting metallization layers disposed over the respective substrates).

One aspect of the present disclosure can be directed to a semiconductor device. The semiconductor device can include a first semiconductor substrate and a second semiconductor substrate. A plurality of first conductive structures can be connected to the first semiconductor substrate. A plurality of second conductive structures can be connected to the second semiconductor substrate. A plurality of first via structures can connect the plurality of first conductive structures to a plurality of third conductive structures. A plurality of second via structures can connect the plurality of second conductive structures to a plurality of fourth conductive structures. The semiconductor device can include a test structure. The test structure can include the plurality of first via structures, the plurality of second via structures, the plurality of third conductive structures, or the plurality of fourth conductive structures. At least some of the plurality of first via structures, the plurality of second via structures, the plurality of third conductive structures, or the plurality of fourth conductive structures of the test structure are intentionally offset from a plurality of respective aligned positions.

The first semiconductor substrate can be a wafer.
The first semiconductor substrate can be a die.
The first semiconductor substrate can include a first active surface having one or more circuits disposed thereupon. The second semiconductor substrate can include a second active surface having one or more circuits disposed thereupon. The first active surface can face the second active surface. The first active surface and the second active surface can be electrically interconnected.

The semiconductor device can include a plurality of intentionally offset third conductive structures offset a first distance in a first direction. The semiconductor device can include a plurality of intentionally offset third conductive structures offset a second distance in the first direction. The semiconductor device can include a plurality of intentionally offset third conductive structures offset a third distance in a second direction, perpendicular to the first direction. The semiconductor device can include a plurality of intentionally offset third conductive structures offset a fourth distance in the second direction.

The third distance can be equal to the first distance and the fourth distance can be equal to the second distance.

The test structure can include a plurality of conductive pads to measure an impedance of the test structure.

One aspect of the present disclosure can be directed to a method. The method can include forming a plurality of first conductive structures over a first semiconductor substrate. The method can include forming a plurality of second conductive structures over a second semiconductor substrate. The method can include forming a plurality of first via structures over the first conductive structures. The method can include forming a plurality of second via structures over the second conductive structures. The method can include forming a plurality of third conductive structures over the first via structures. Some of the third conductive structures can be offset from a plurality of respective aligned positions. The method can include electrically coupling the third conductive structures to the second via structures.

The method can include forming a plurality of fourth conductive structures over the second via structures. The plurality of fourth conductive structures can be offset from the respective aligned positions.

A first portion of the third conductive structures can be intentionally offset a first distance in a first direction. A second portion of the third conductive structures can be intentionally offset a second distance in the first direction. A third portion of the third conductive structures may not be intentionally offset.

The second distance can be greater than the first distance.

Electrically coupling the third conductive structures to the plurality of the second via structures can include one or more intermediate structures.

One aspect of the present disclosure can be directed to another method. The method can include forming a first interconnect structure having one or more intentionally offset portions over a first semiconductor substrate. The method can include forming a second interconnect structure over a second semiconductor substrate. The method can include electrically coupling the second interconnect structure to the first interconnect structure to form a semiconductor device interconnect structure. The semiconductor device interconnect structure can include one or more test structures. The method can include measuring an impedance of the one or more test structures via conductive pads. The method can include comparing the impedance to one or more predefined impedance thresholds. The method can include predicting a performance of one or more circuits of the first semiconductor substrate or the second semiconductor substrate. The prediction can be based on the comparison of the impedance to the one or more predefined impedance thresholds.

The second interconnect structure can be joined to the first interconnect structure by an intermediate interconnect structure.

The method can include associating the impedance of the one or more test structures with an alignment mark. The first semiconductor substrate can have a first portion of the alignment mark. The second semiconductor substrate can have a second portion of the alignment mark. The alignment mark can be configured for use with a vision system.

The vision system can be an infrared system to detect the first portion of the alignment mark through the second semiconductor substrate or the second portion of the alignment mark through the first semiconductor substrate.

The test structures can include a plurality of via structures connected by a plurality of conductive structures. The impedance of the test structures can be determined based on a first one of the conductive pads and a second one of the conductive pads. The impedance of the test structures, prior to electrically coupling the second interconnect structure to the first interconnect structure, can be indicative of an open circuit.

The first one of the conductive pads and the second one of the conductive pads can both be included in one of the first interconnect structure or the second interconnect structure.

The impedance of the test structures can be a resistance of the test structures

Wafer bonding, e.g., the stacking of semiconductor substrates such as complete wafers or portions thereof, aims to overcome scaling limitations experienced in semiconductor devices by increasing device density in volume rather than area. Although wafer bonding has been successfully demonstrated and implemented, the determination of the wafer to wafer alignment is substantially more difficult. Alignment detection of bonded wafers and other semiconductor substrates is being pursued. For example, the determination of an alignment can determine viable or non-viable semiconductor devices, as well as a performance thereof in advance of the completion of a semiconductor device, and can provide greater process flow data, which can be recursively incorporated to improve a process.

Techniques herein include methods of forming test structures. Techniques herein enable a test structure portion to be formed along one or more layers (e.g., metallization layers formed over a substrate). The test structure portions can be configured to interface with a corresponding test structure portion formed along another surface of one or more layers (e.g., metallization layers formed over another substrate). The test structures can be a via chain of alternating vertical and lateral conductive elements. The relative alignment or misalignment of the respective substrates (or one or more intervening layers) of a single test structure can determine a magnitude of an offset. For example, a greater offset may reduce or increase a contact surface area or otherwise affect one or more electrical connections between the upper portion of the semiconductor device and a lower portion of the semiconductor device.

A plurality of test structures can determine an offset direction. For example, a plurality of test structures can include intentional offsets in one or more lateral directions (e.g., along a lateral axis). For example, a first test structure can be offset in a positive X direction, and a second test structure can be offset in a negative X direction. The surface area of the contact between upper and lower portions can be determined, e.g., by measuring an impedance through a circuit including one or more such contacts, such as along a via chain comprising a plurality of contacts. For example, if the impedance of the first test structure is greater than the impedance of the second test structure, if can be determined that the second test structure has a greater surface area of contact between a respective upper and lower portion. Such an increase in surface area of contact can be attributed to an alignment shift in the positive X direction (to negate the intended offset of the second test structure). Various averages, checks, and other statistical methods can be employed to determine a particular alignment magnitude, direction, or confidence.

Methods herein are compatible with other alignment marks. The alignment marks can determine gross positions of semiconductor device components, and the test structures can determine additional or localized alignment data. Some test structures can be smaller than alignment marks and thus can be disposed closer to one or more circuits of interest. For example, a test structure can be formed in upper metallization layers disposed over a substrate which are otherwise filled with dielectric. Thus, a more granular alignment map can be generated of a semiconductor substrate based on the test structures. Alignment data of the test structures can be combined with additional alignment data, such as alignment mark data to form an alignment map of a wafer or another substrate.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise. References to "or" may be construed as inclusive so that any terms described using "or" may indicate any of a single, more than one, and all of the described terms.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
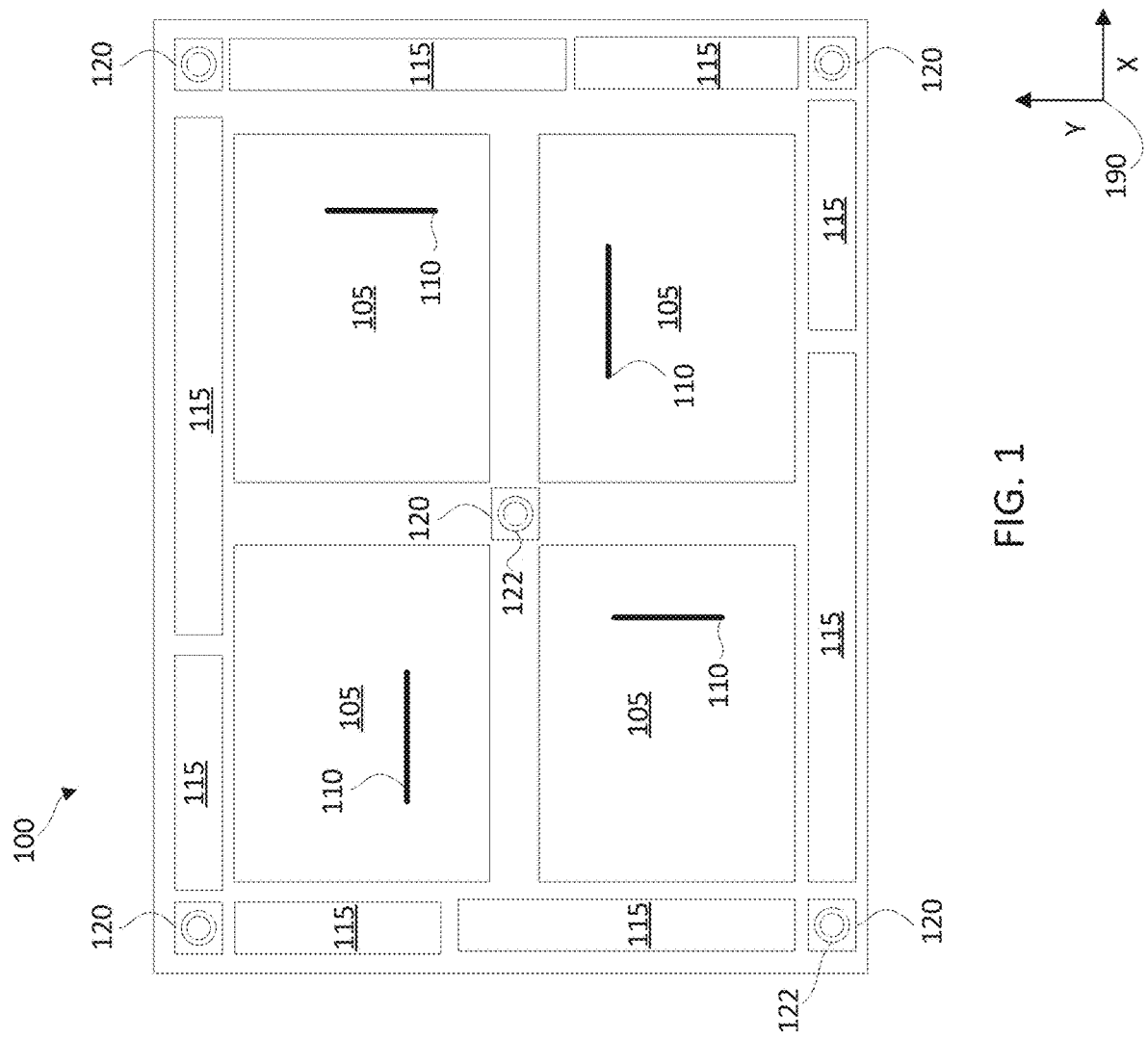
FIG. 1 illustrates a die of a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more test structures having an upper portion and a lower portion wherein each portion is associated with a semiconductor substrate. In some embodiments, the test structures can include a via structure such as an interlayer via and a conductive structure such as a lateral conductive element of a metallization layer of a semiconductor substrate. The test structures can include one or more conductive pads accessible by a test instrument to determine a performance characteristic thereof such as an impedance. For example, the impedance can be related to an offset such that an offset can be determined for a portion of a semiconductor device comprising the test structure, which can be represented by an alignment map or chart. Alignment charts can be combined to form an alignment map across multiple regions of a physical semiconductor wafer or another substrate.

Reference will now be made to the figures, which for the convenience of visualizing the semiconductor devices described herein, illustrate substrates undergoing process flows in both top and cross-sectional views. In the top and cross-sectional views of the figures, connections between conductive layers or materials may be shown. However, it should be understood that these connections between various layers and masks are merely illustrative, and are intended to show a capability for providing such connections and should not be considered limiting to the scope of the claims. Further, offsets can be relative to an intended location of a corresponding terminal (e.g., assuming perfectly aligned substrates and layers disposed there over), or can illustrate a deviation from an intended location of a corresponding terminal. An alignment can be determined based on the relative difference (or lack thereof) between the intended and actual location of the corresponding terminals of interest. Thus offsets between two interfacing surfaces can be generated by adjusting the position of a feature on either or both surfaces, relative to a respective aligned position. As used herein, a respective aligned position refers to the position that a corresponding element a non-misaligned semiconductor device will interface with.

Although the figures and aspects of the disclosure may show or describe devices herein as having a particular shape, it should be understood that such shapes are merely illustrative and should not be considered limiting to the scope of the techniques described herein. For example, although certain figures show various via structures, alignment marks, or other electric structures in a rectangular configuration, other shapes are also contemplated, and indeed the techniques described herein may be implemented in any shape or geometry.

FIG. 1 illustrates a die 100 of a semiconductor device. The die 100 can include an active surface having one or more device blocks 105 disposed thereupon. Each device block 105 can be or include one or more circuits such as logical, radio frequency, or power conditioning circuits. One or more device blocks 105 or other portions of the die 100 can include test structures. For example, the die can include a via chain portion 110 or a plurality of alignment marks 120 for a vision system. The via chain portion 110 can include a plurality of via structures or other conductive elements (e.g., to join the via structures). For example, the via chain portion 110 can be configured to interface to a second via chain portion 110 (e.g., a mirror image of the via chain portion 110) on another semiconductor die 100. The via chain portion 110 can be any shape. For example, the via chain portion 110 can be linear, or form a serpentine structure based on one or more available areas.

The semiconductor die 100 includes an alignment mark 120 at a center point thereof. Additional alignment marks 120 are disposed around a periphery of the semiconductor die, or at other locations. The alignment mark 120 can include various deigns. For example, the alignment mark 120 can include a crosshair, circular feature, or an arrow point. The alignment mark 120 can be detected by a vision system such as a vision system based on ambient visible light, selective application of specific light frequencies (e.g., by a laser), or an infrared camera. In some embodiments, an infrared camera can detect one or more alignment marks 120 through a semiconductor die 100. For example, the first semiconductor die 100 can include a first alignment mark 120 including a first circle 122, and a second semiconductor die 100 can include a second alignment mark 120 including a second circle, concentric with the first circle 122, or another portion such as a crosshair or geometric shape configured to be viewed in combination with the first alignment mark 120 to determine a relative position (e.g., alignment) of the first semiconductor die 100 relative to the second semiconductor die 100.

In some embodiments, semiconductor dies 100 may omit an alignment mark 120. For example, a first portion of dies 100 of a wafer can include alignment marks 120, and a second portion of dies 100 of the wafer can determine an alignment based on a geometric relationship to the dies 100 having alignment marks 120, or another portion of the wafer. For example, various references can be disposed around the periphery of the wafer, or can be referenced based on a feature of the die 100 or wafer, such as an edge or a TSV. The additional alignment marks 120 can be sacrificial or disposed over a sacrificial portion of a semiconductor device. For example, the alignment marks 120 can be disposed over kerf/scribe lines at the periphery of the die 100, which may be removed or damaged during a dicing operation. Indeed, the kerf/scribe lines or other sacrificial portions of a semiconductor device can contain various additional test structures 115. The additional test structures 115 can include ring oscillators, memory devices, conductive pads configured to allow for the verification of various open circuits or short circuits of an active surface of the die 100, via chain portions 110, and the like. Some additional test structures 115 can be disposed over a non-sacrificial portion of the semiconductor device. For example, some additional test structures 115 can be configured for access or otherwise remain during the fabrication of a semiconductor device. In some embodiments, the test structures can be electrically connected to one or more active circuits of the semiconductor device.

The semiconductor die 100 can be diced from a wafer, or can be disposed within a wafer including one or more additional semiconductor dies 100. For example, the various layers formed over the semiconductor substrates can be formed over individual dies or wafers comprising a plurality of dies 100. The alignment marks 120 can be included on individual dies 100 or wafers. For example, a wafer can include a plurality of alignment marks 120 (e.g., on various dies 100, kerf lines, or peripheral portions thereof). The alignment marks 120, and any other alignment features such as one or more edges of the semiconductor substrate (e.g., the die 100 or wafer) can be examined. Any detected misalignments can be processed to determine an alignment map of the substrate. For example, the plurality of alignment marks 120 can each have one or more misalignment values associated therewith (e.g., an X direction misalignment value and a Y direction misalignment value associated with an axis 190 of the semiconductor die 100), from which a alignment map can be generated. For example, the alignment map can include the measured misalignment of the alignment marks 120, along with a determined misalignment for additional portions of the semiconductor substrate. The alignment of the additional portions can be determined based on linear interpolation, curve fitting, or performance information, such as the performance of various test structures (e.g., the oscillation frequency of ring oscillators, or the impedance of via chains or other test structures).

Figure 2:
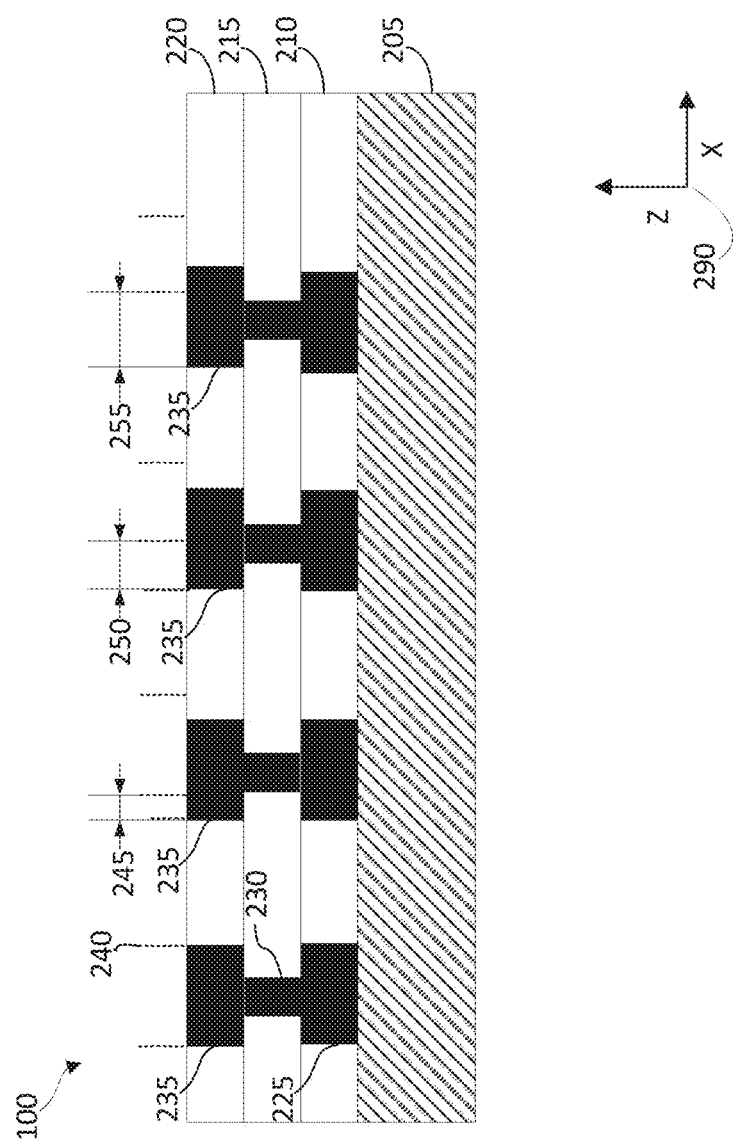
FIG. 2 illustrates a cross sectional view of a semiconductor die during a fabrication stage, in accordance with some embodiments.

FIG. 2 is a cross sectional view of a semiconductor die 100 during a fabrication stage, in accordance with some embodiments. The semiconductor die 100 includes a semiconductor substrate portion 205 (e.g., silicon, gallium arsenide, or the like). The semiconductor substrate portion can include an active surface having one or more circuits disposed thereupon. For example, the circuits can be or include a portion of the device blocks 105 of FIG. 1. The semiconductor die 100 can include one or more layers comprising a plurality of conductive structures or via structures. A first layer 210 is disposed over the substrate portion 205. For example, the first layer can be disposed immediately over the substrate portion 205 such that the conductive structures 225 of the first layer 210 can electrically connect to the circuits of the substrate portion 205. In some embodiments, one or more layers (not depicted) can be disposed between the substrate portion 205 and the first layer 210. For example, a plurality of layers can be disposed between the substrate portion 205 and the first layer 210 (e.g., to electrically interconnect the circuits of the substrate 205 or to deliver connections from the substrate 205 to a terminus of the device for delivery to another semiconductor substrate). In some embodiments, all or a portion of the plurality of conductive structures or via structures which are mechanically coupled to the semiconductor substrate 205 (e.g., through a plurality of layers) can be electrically isolated from the semiconductor substrate 205.

The conductive structures or via structures can interconnect the circuits of the active surface of the die 100. Some conductive structures or via structures can be or include a bonding pad (e.g., a copper bonding pad) configured to electrically connect to a bonding pad of another semiconductor die (e.g., a diced die or a die of a wafer). The bonding pad can be electrically connected to the active surface of the substrate portion 205. For example, the bonding pad can be configured to deliver a signal (e.g., a data, clock, or power signal) to a corresponding bonding pad. The corresponding bonding pad can deliver the signal to another semiconductor substrate or a probe pad.

A second layer 215 can contain a plurality of via structures 230 to electrically connect the conductive structures 225 of the first layer to conductive structures 235 of a third layer 220. The conductive structures 235 of the third layer 220 can be configured to electrically or mechanically couple with additional conductive structures. For example, the conductive structures 235 of the third layer 220 can be, include, or interface with a bonding pad configured to bond with a corresponding bonding pad. The bonding pads can connect directly, or with an intervening material. In some embodiments, the bonding pads can be joined by a process such as a plasma activation process or an annealing process.

The bonding pads can be aligned relative to a respective aligned position of a corresponding bonding pad. For example, the bonding pad can be placed at a position such that an offset between the bonding pad and a corresponding bonding pad can be defined at least in part by manufacturing variances of alignment. A first junction offset 240 between a conductive structure 235 of the third layer 220 and a receiving position for a corresponding bonding pad is depicted in alignment (e.g., as 0). In some embodiments, an alignment can be intentionally offset. For example, a second junction offset 245 between a conductive structure 235 of the third layer 220 and a receiving position for a corresponding bonding pad is depicted out of alignment. A decrease or increase in alignment can be attributed at least in part to manufacturing variances of alignment of the respective bonding pads. A third junction offset 250 and fourth junction offset 255 are increasingly offset from a respective aligned positions for bonding pads such as conductive structures 235 of the third layer 220.

The various bonding pads can be offset in various directions. For example, the conductive structures or via structures can be offset an opposite direction, or in another direction such as a direction perpendicular to the second junction offset 245, third junction offset 250, and fourth junction offset 255 (e.g., can be offset in a direction into or out of the page of FIG. 2). Some offsets can have components in multiple directions, such as along an X or Y axis 290 of the die 100.

Figure 3:
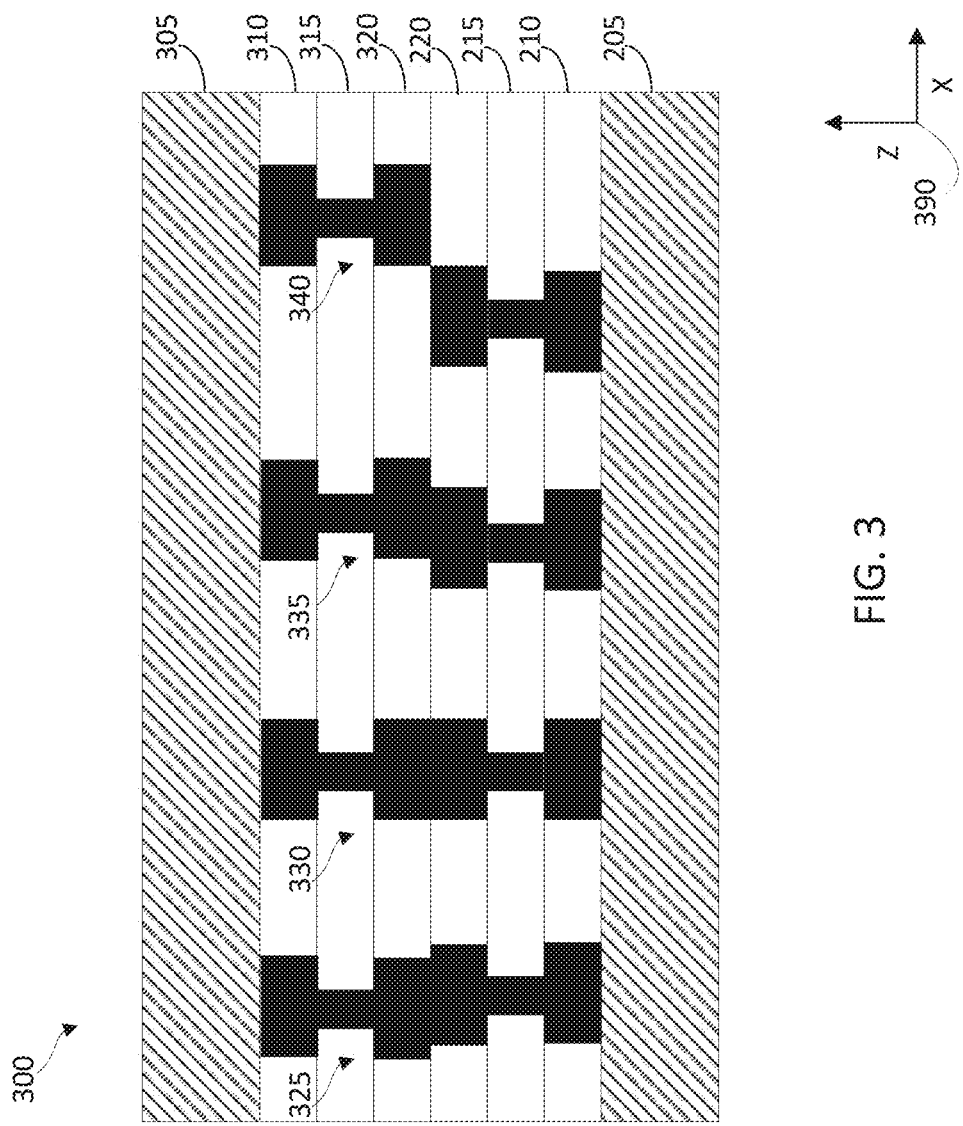
FIG. 3 illustrates a cross sectional view of a semiconductor device during a fabrication stage, in accordance with some embodiments.

FIG. 3 is a cross sectional view of a semiconductor device 300 during a fabrication stage, in accordance with some embodiments. For example, the semiconductor device 300 can be or include the semiconductor die 100 of FIG. 2. The semiconductor device 300 includes a plurality of test structures. A first test structure 325 is depicted with a first offset. The offset can be a result of a misalignment of an upper die (e.g., the upper substrate 305 or a metallization layer thereof) relative to a lower die (which may be the die 100 of FIG. 1). In some embodiments, the offset can be a result of a gross wafer or die misalignment (e.g., a homogenous offset present across the semiconductor device 300 due to a position of the respective substrates). In some embodiments, the offset can be a local misalignment (e.g., an offset which is present in one portion of the substrate, but not another, such as due to non-linearity or flexing of the substrate). For example, the respective bonding pads of the first test structure 325 can be aligned relative to a position (e.g., an expected positon) of a corresponding bonding pad such that the entire offset, or a portion thereof can be indicative of a misalignment.

A second test structure 330 comprises an upper portion and a lower portion, wherein the upper portion and the lower portion are aligned. The alignment can be intentional or a result of a misalignment of an upper semiconductor substrate 305 relative to a bottom semiconductor substrate 205, which counteracts an intended offset thereof. A third test structure 335 includes an upper portion offset from a lower portion in an opposite direction of the first test structure 325. A fourth test structure 340 is offset from the third test structure 335, with an offset greater than a lateral dimension (e.g., along the positive X axis 390) of the bonding pad of the upper portion of the fourth test structure 340 or a lower portion of the fourth test structure 340. The offset can result in an open circuit between the upper portion of the fourth test structure 340 and the lower portion of the fourth test structure 340.

An alignment of a semiconductor device 300 at a position of the test structures can be inferred based on a performance of the test structures. An alignment chart can be generated based on the performance of the various test structures at a region of the semiconductor device 300. The alignment chart can include or be based on additional data such as alignment marks, wafer features, and the like. For example, an impedance of the first test structure 325 can be determined to be greater than the impedance of the second test structure 330. The impedance of the first test structure 325 can be equal to the impedance of the third test structure 335, and less than the impedance of the fourth test structure 340. The impendence of the fourth test structure 340 can be indicative of an open circuit, such as 100Ω, 1kΩ, or 10kΩ. Various thresholds can be assigned to various processes, dielectric materials, alignment requirements, etc. In some embodiments, a complex impedance can be determined. For example, a capacitance, inductance, or other performance of the test structure can be indicative of a performance of the semiconductor device 300 such as an alignment thereof.

Each of the test structures can include a plurality of laterally offset vertical structures. For example, the first test structure 325 can include a plurality of vertical structures, each vertical structure formed from one or more conductive structures to laterally connect the vertical structures, and one or more via structures to vertically connect the conductive structures. The vertical structures can be disposed laterally behind (or otherwise connected to) the depicted vertical structure of the first test structure 325, other test structures. For example, the depicted test structures can include 5, 50, or 500 of the depicted vertical structures.

Figure 4:
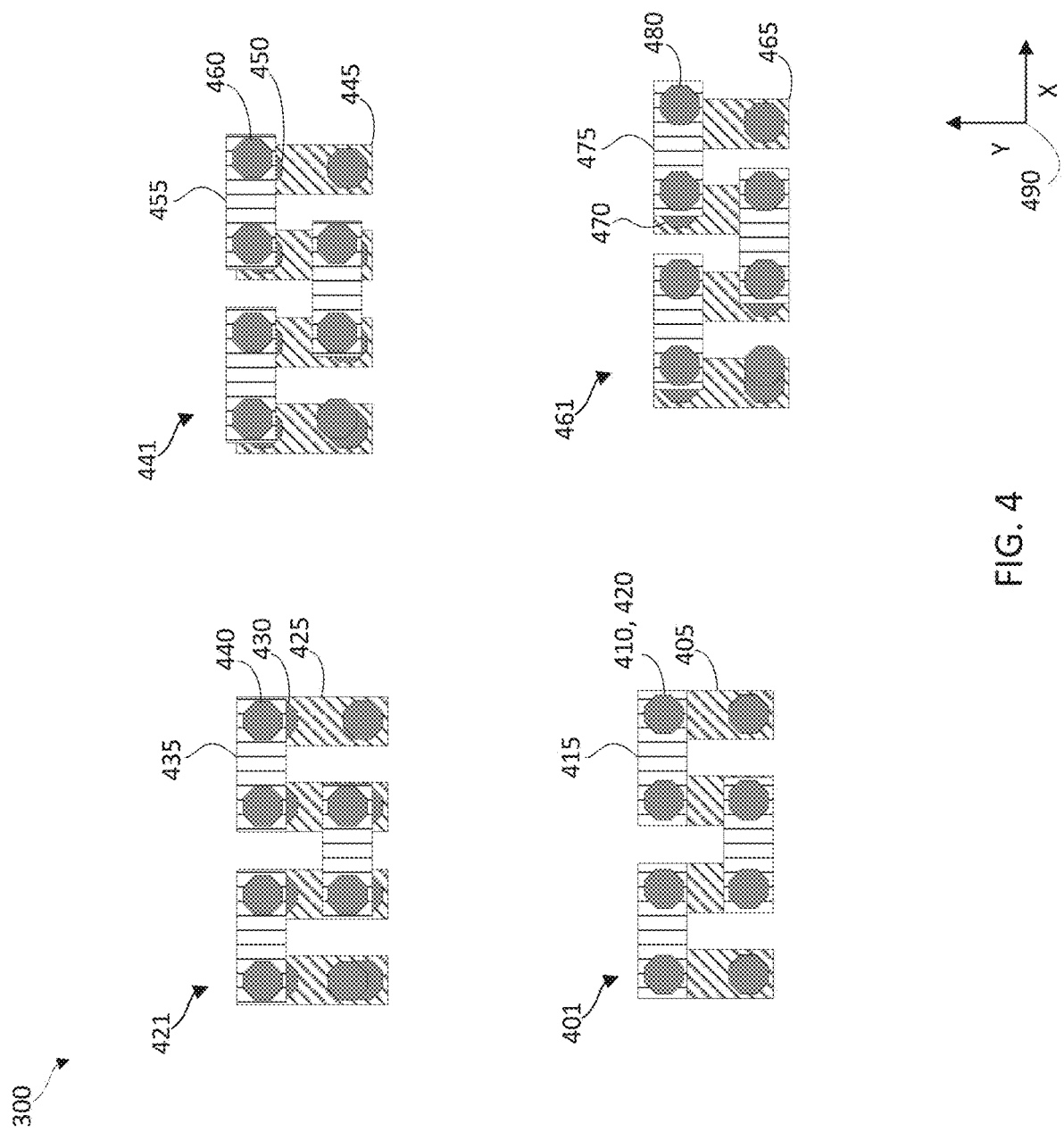
FIG. 4 illustrates a top view of a semiconductor device having a plurality of test structures, in accordance with some embodiments.

FIG. 4 is a top view of a semiconductor device 300 having a plurality of test structures, in accordance with some embodiments. For example, a first test structure 401 includes a plurality of first lower conductive structures 405, and a plurality of first lower via structures 410. The first lower conductive structures 405 and first lower via structures 410 can be disposed over a lower semiconductor substrate. The first test structure 401 can include a plurality of first upper conductive structures 415 and first upper via structures 420. The first upper conductive structures 415 and first upper via structures 420 can be disposed over an upper semiconductor substrate. An upper portion of the first test structure 401 can be configured to align with the lower portion of the first test structure 401. For example, the test structures can include one or more pairs of bonding pads to connect the upper portion (e.g., disposed over the upper semiconductor substrate) to the lower portion (e.g., disposed over the lower semiconductor substrate).

A second test structure 421 includes a plurality of second lower conductive structures 425 and second lower via structures 430 disposed over the lower semiconductor substrate. A portion or connection of the second lower conductive structures 425 or second lower via structures 430 (e.g., a bonding pad) is intentionally laterally offset from a corresponding bonding pad associated with at least one of a second upper conductive structure 435 or second upper via structure 440 along a positive Y direction. The second upper conductive structure 435 and second upper via structure 440 are disposed over the upper semiconductor substrate. The offsets are relative between the upper and lower portions of the connection structures, and can be realized by an offset applied to the lower, upper, or both portions. Indeed, because the offsets are relative, an offset can be described as being based on either interfacing portion.

A third test structure 441 includes a lower portion having a third lower conductive structure 445 and a third lower via structure 450 disposed over a lower semiconductor substrate. The third test structure 441 includes a third upper conductive structure 455 and a third upper via structure 460 disposed over an upper semiconductor substrate. The lower portion and upper portion of the third test structure 441, and other test structures, can include a corresponding pair of bonding pads, whereby the offset between the upper portion and the lower portion affects the surface area, shape, or other characteristics of an electrical connection (or non-connection) between the respective bonding pads. The characteristics of the electrical connection can be determined according to an impedance, such as a DC impedance, or an impedance at one or more frequencies. The upper portion of the third test structure 441 is offset, relative to the lower portion, in a positive X and positive Y direction.

A fourth test structure 461 includes an upper portion disposed over an upper semiconductor substrate and lower portion disposed over a lower semiconductor substrate, wherein the lower portion (e.g., the fourth lower conductive structures 465 or fourth lower via structures 470) is offset in the positive X direction relative to the upper portion (e.g., the fourth upper conductive structures 475 or fourth upper via structures 480). Additional test structures can include additional offsets in along the X or Y axis 490 or a combination thereof. For example, a plurality of test structures can include offsets having a magnitude in the positive X and positive Y directions (e.g., first quadrant test structures), positive X and negative Y directions (e.g., second quadrant test structures), negative X and negative Y directions (e.g., third quadrant test structures), or negative X and positive Y directions (e.g., fourth quadrant test structures), as depicted in FIG. 5.

The various offset quadrants are merely a classification of test structures, and need not correspond to a location thereof. Any test structure can be location at any location and in any shape. For example, test structures can be formed in linear, serpentine, spiral, or other patterns. The locations of the test structures can be determined in conjunction with or subsequent to the routing of various connections between one or more of the substrates (e.g., between the semiconductor substrates or between one substrate and a terminal of the device). For example, the test structures can be defined in one or more upper layers of the semiconductor device which are not occupied by other connections. The test structures can a standard pattern (e.g., a linear pattern) to harmonize the geometry thereof, or can include a plurality of patterns (e.g., to improve a route-ability of the test patterns in various locations).

The test patterns can include a probing pad to electrically couple a test instrument to the test structure. For example, the test device can measure an impedance (e.g., a resistance or a complex impedance at one or more frequencies or magnitudes). For example, the probing pad can be disposed laterally offset from the substrate (e.g., by one or more conductive structures or via structures), can transit through the substrate (e.g., by a TSV), or an opening in the substrate can be formed to enable the test instruments to access the probing pad. In some embodiments, the test structure can be electrically isolated from one or more semiconductor substrates, and the test instrument can be an external device. In some embodiments, the test structure can be electrically connected to one or more semiconductor substrates, and the test structure can be or include the semiconductor substrate. The test instrument can determine an absolute or relative impedance (e.g., relative to other test structures) such that the localized impedance of each test structure can be normalized to other process variations (and may be further indicative of a wafer or die performance).

Figure 5:
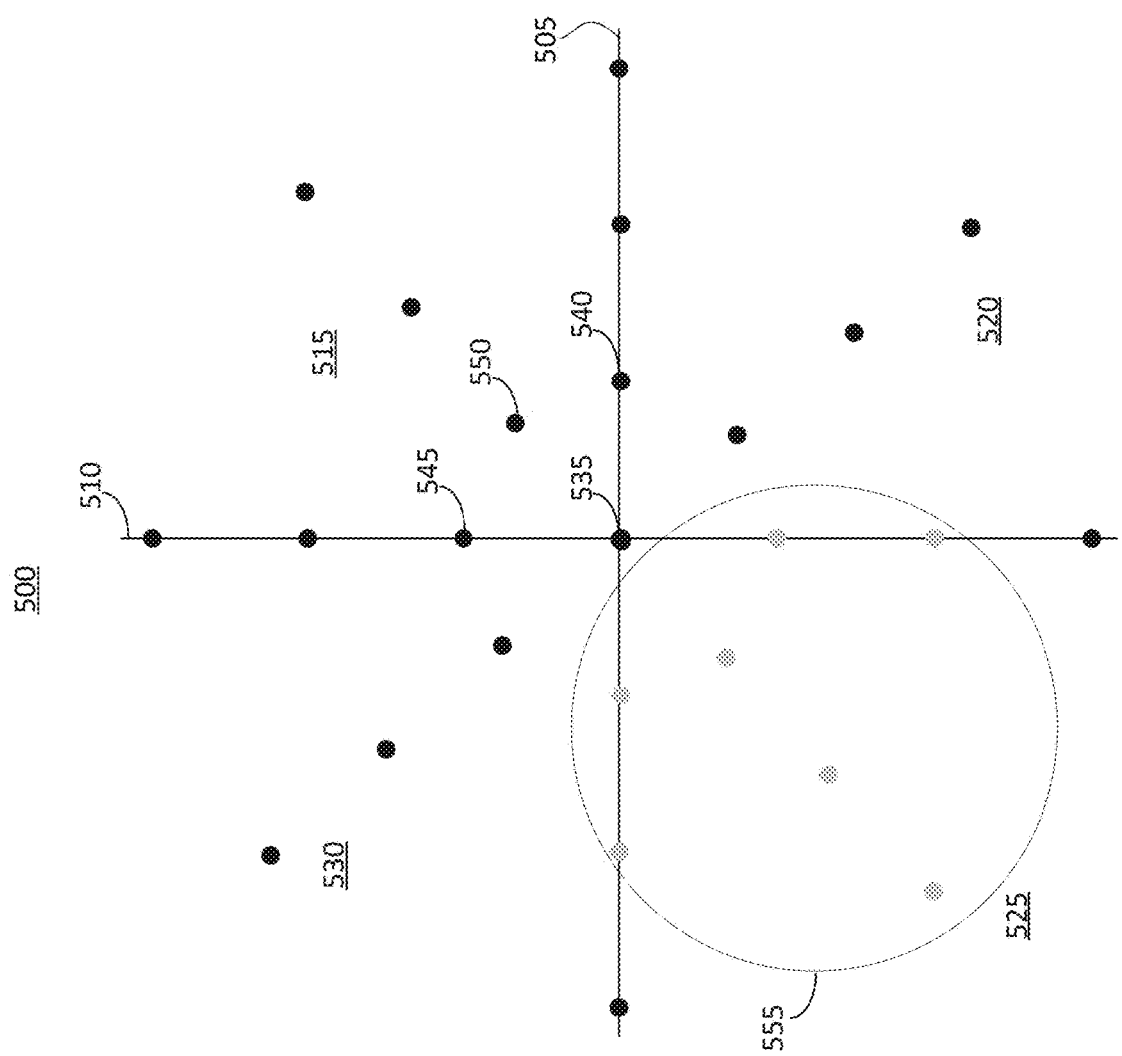
FIG. 5 is an alignment chart of the misalignment of test structures of a region of a substrate, in accordance with some embodiments.

FIG. 5 is an alignment chart 500 of the misalignment of test structures of a region of a substrate, in accordance with some embodiments. The alignment chart 500 includes a plurality of test structure performance characteristics corresponding to a plurality of alignments. For example, the alignment chart 500 includes an X axis 505 and a Y axis 510 which may correspond to the axis 150 of FIG. 4. For example, the performance characteristics of the test structures of FIG. 4 can be disposed within a first quadrant of the alignment chart 500. As discussed with regards to FIG. 4, a second quadrant 520 can include test structures configured for a positive offset along the X axis 505 and a negative offset along the Y axis 510. A third quadrant 525 can include test structures configured for a negative offset along the X axis 505 and a negative offset along the Y axis 510. The fourth quadrant 530 can include test structures configured for a negative offset along the X axis 505 and a positive offset along the Y axis 510. The quadrants are indicative of an expected offset, and not necessarily a measured offset. For example, any offset could be measured based on an alignment of the various portions of the semiconductor device.

Each test structure performance characteristic (or set thereof) can be correlated to a test structure offset. For example, a reference test structure performance characteristic 535 having no intentional offset can be placed at an origin of the alignment chart 500. A first X axis 505 test structure performance characteristic 540 can be based on a test structure having an intentional offset along the positive X axis 505, such as the fourth test structure 461 of FIG. 4. A first Y axis 510 test structure performance characteristic 545 can be based on a test structure having an intentional offset along the positive Y axis 510, such as the second test structure 421 of FIG. 4. A first hybrid test structure performance characteristic 550 can be based on a test structure having an intentional offset along the positive X axis 505 and positive Y axis 510, such as the third test structure 441 of FIG. 4.

Additional test structure performance characteristics can be defined at greater or lesser offsets (e.g., in one or more lateral directions such as the X axis 505 or Y axis 510). A physical location of the test structures need not correspond to the offsets. For example, test structures corresponding to an extreme portion, away from the origin, of the first quadrant can be physically adjacent to an opposite extreme portion, away from the origin, of the third quadrant. Each test structure performance characteristics (or set) can be categorized such as according to a plurality of thresholds (e.g., pass or fail; pass, marginal, or fail; high performance, standard performance, low performance, inoperable; etc.). An offset of the various test structures can be determined based on the performance (e.g., impedance) of the test structures. Misalignments in the semiconductor substrate or other portions of the semiconductor device (e.g., metallization layers) can result in offsets varying from the intentional offsets. For example, the performance of a plurality of test structure performance characteristics can be higher (e.g., impedance can be lower) in a region of the alignment chart 500. In an aligned chart, the high performance characteristic can be maximum at the origin, and lesser at the greater offset portions. Higher performance (e.g., lower impedance) regions or lower performance regions (e.g., higher impedance, including indications of an open circuit) can be indicative of alignment or misalignment, from which an alignment or misalignment of other connections (e.g., connections to a semiconductor substrate) can be inferred. For example, a plurality of test structure performance characteristics 555 in the third quadrant 525 can have a high performance indicating alignment. Thus, a predicated alignment of other nearby connections can be determined to be misaligned along the negative X axis 505 and the negative Y axis 510.

The various physical locations of the test structures corresponding to an alignment chart 500 can be localized such that the distance between the test structures can be ignored, or the physical distance between test structures can be normalized. For example, if an adjacent indicia of alignment (e.g., an alignment mark or another alignment chart 500) indicates another alignment, the location of the various test structures associated with the alignment chart 500 can be adjusted based on their physical location. A semiconductor device can include a plurality of alignment charts 500 associated with various physical regions. For example, alignment charts 500 can be determined for semiconductor device regions (e.g., proximal to circuits of interest) which do or do not contain alignment marks (e.g., to avoid using a surface area of the active surface used for the circuits disposed thereupon). For example, the test structures can be placed over unused upper layers of a semiconductor die to reduce or avoid competing with other circuits of the semiconductor die.

Figure 6:
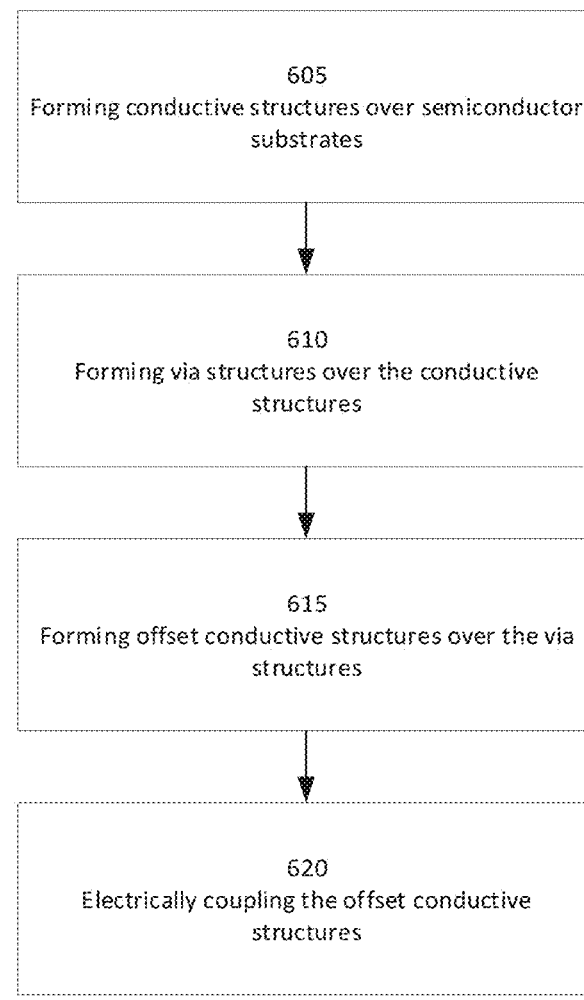
FIG. 6 is a flow chart of a method for making a semiconductor device, in accordance with some embodiments.

FIG. 6 is a flow chart of a method 600 for making a semiconductor device, in accordance with some embodiments. In brief overview, the method 600 starts with operation 605 of forming conductive structures over first and second semiconductor substrates. The method 600 continues to operation 610 of forming via structures over the conductive structures. In various embodiments, the via structures can be generally cylindrical. The method 600 proceeds to operation 615 of forming offset conductive structures over the via structures. The method 600 proceeds to operation 620 of electrically coupling the offset conductive structures.

At operation 605, conductive structures are formed over a plurality of semiconductor substrates. For example, the conductive structures can be formed in a layer of the semiconductor device which is connected to the die substrate, or another layer of the semiconductor device. For example, a plurality of layers can be disposed between the conductive structure and the die substrate. The conductive structures can traverse the semiconductor device in one or more lateral dimensions. One or more of the conductive structures can be offset (e.g., with respect to each other) in one or more perpendicular lateral dimensions (e.g., an X and Y axis of the semiconductor device, wherein a Z axis defines a height of the semiconductor device). The offsets can be of one or more magnitudes, such that the amplitude of a misalignment can result in one or more of the offsets exceeding a corresponding dimension of a corresponding bonding pad (e.g., can result in an open circuit), or can result in the offset being less than the dimension of the corresponding bonding pad (e.g., can result in a closed circuit).

In some embodiments, the conductive structures can be, include, or electrically connect to a probing pad. For example, the probing pad can be, include, or be electrically connected to a TSV extending through an associated substrate. A plurality of conductive structures can be associated with a plurality of probe pads. For example, two probe pads (e.g., an anode and a cathode) can be disposed through a same substrate for a test structure, such that an impedance of a test structure can be probed from one side of the semiconductor device. In some embodiments, the probe pads can be otherwise disposed through the semiconductor substrate such as through an opening, or can be routed laterally away from the semiconductor substrate such as to a test location disposed laterally alongside the semiconductor substrate. In some embodiments, the probe pads can be connected to the substrate such as for connection to a circuit thereof (e.g., a circuit to detect an impedance of a test structure comprising the conductive elements). The conductive structures can be connected by the selective removal of a dielectric of a layer of the semiconductor device, and forming metal in an opening formed from the removal of the dielectric. Any excess metal can be removed by a planarization process such as chemical mechanical grinding or polishing (CMG/P).

At operation 610, via structures are formed over the conductive structures. The via structures can be vias to electrically connect adjacent layers of the semiconductor device, through layer vias traversing a plurality of semiconductor layers, or another electrically conductive vertical element such as a bond wire. The via structures can be formed simultaneously with one or more of the conductive structures, such as by a dual damascene process, can be formed separately, or can be placed (e.g., in the case of a through layer via or a bond wire). The via structures can be disposed within a dielectric body, such as a dielectric etched to form openings for the via structures, as for the conductive structures of operation 605.

At operation 615, offset conductive structures are formed over the via structures. The via structures can be electrically connected to the offset conductive structures. For example, the via structures and the conductive structures can be a same metal such as copper. The conductive structures can include solder bumps/micro bumps or another intermediate connector, or can be conductive pillars (e.g., copper, aluminum, tungsten, or the like). For example, the conductive structures formed over each substrate can be or include copper bonding pads configured to interface with a corresponding copper bonding pad formed over the corresponding substrate. The conductive structures formed over corresponding semiconductor substrates can be offset relative to each other. For example, the conductive structures formed in operation 605 can be formed with an offset, and the conductive structures formed over the vias can be aligned thereto. In some embodiments, the conductive structures formed over the vias can be offset from the conductive structures formed in operation 605, such as to extend or reduce an offset thereof, or to introduce an offset where the respective conductive structures formed in operation 605 are not offset.

At operation 620, the conductive structures formed at operation 615 are electrically coupled. The coupling can include any die to die, wafer to wafer, or die to wafer process. For example, the conductive structures can be electrically coupled according to a copper hybrid bonding process, plasma activated bonding, eutectic bonding, and so on. The active surfaces of the semiconductor device can face each other (e.g., inward in a semiconductor device formed from the electrical coupling of operation 620). In some embodiments, other facings of the active surface of the semiconductor device can be employed such as back to back or front to back facings, which can include additional semiconductor substrates (e.g., for a stacked memory device). In some embodiments, an intermediate layer can be disposed between the respective portions of the semiconductor device.

Figure 7:
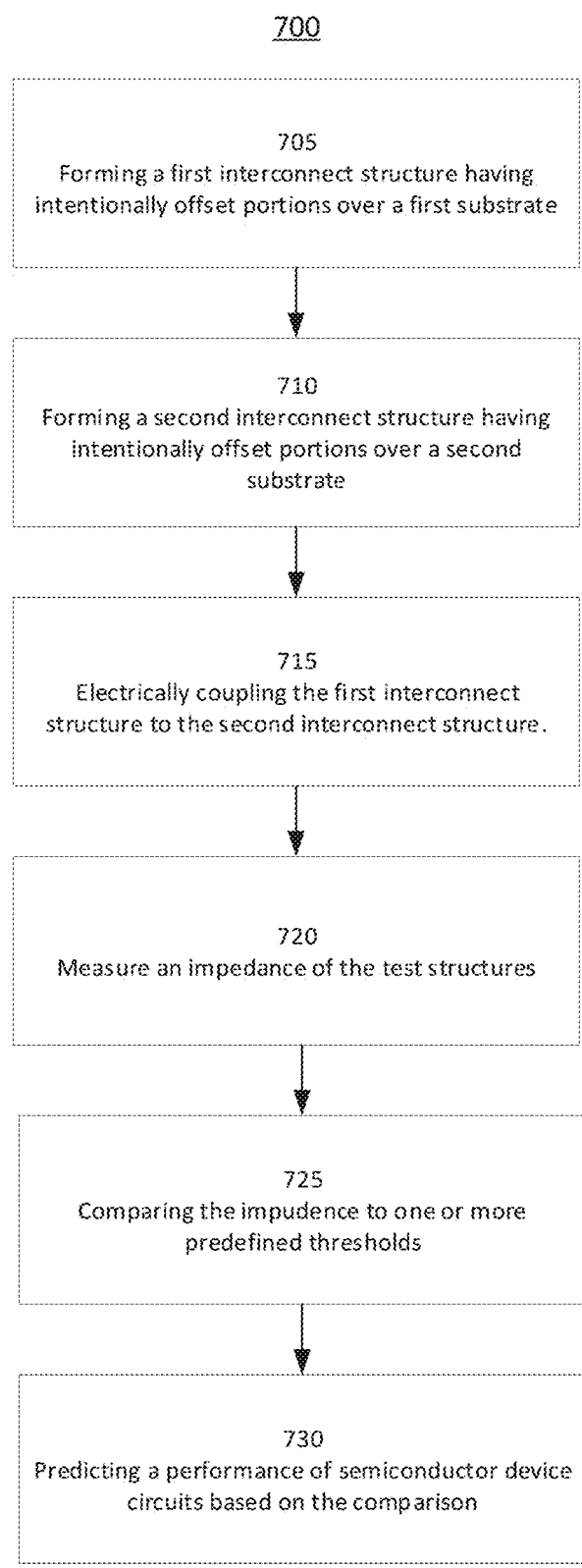
FIG. 7 is a flow chart of a method for predicting semiconductor device performance, in accordance with some embodiments.

FIG. 7 is a flow chart of a method 700 for predicting semiconductor device performance, in accordance with some embodiments. In brief overview, the method 700 starts with operation 705 of forming a first interconnect structure having intentionally offset portions over a first substrate. The method 700 continues to operation 710 of forming a second interconnect structure having intentionally offset portions over a second substrate. The method 700 proceeds to operation 715 of electrically coupling the first interconnect structure to the second interconnect structure. The method 700 proceeds to operation 720 of measuring an impedance of test structures formed from the first interconnect structure and the second interconnect structure. The method 700 proceeds to operation 725 of comparing the impedance to a plurality of predefined thresholds. At operation 730, the performance of circuits of the semiconductor device are predicted based on the comparison.

At operation 705, a first interconnect structure is formed over a first substrate, the first interconnect structure having intentionally offset portions (relative to a second interconnect structure). For example, the first interconnect structure can include any conductive structures, via structures, bonding pads, probing pads, and first interconnections thereof. The first interconnect structure can be disposed within a dielectric body or formed over the first substrate. For example, the first interconnect structure can include an alternating pattern of a via chains having open circuits, with bonding pads to receive a further portion of the via chain to compete (e.g., close) the open circuits. The first interconnect structure can include a portion of a test structure and various interconnections between the first substrate and a second substrate, or additional terminals.

At operation 710, a second interconnect structure is formed over a second substrate. The second interconnect structure can be or include portions which are substantially congruent to (e.g., a mirrored image of) the first interconnect structure, or can be different from the first interconnect structure. For example, the second interconnect structure can include bonding pads aligned with the bonding pads of the first interconnect structure, or offset therefrom. The second interconnect structure can include a same or different number of vias, conductive structures, probe pads, layers, a geometry (e.g., thickness) of layers, etc. For example, one of the first interconnect structure or the second interconnect structure can omit probe pads or have differently disposed probe pads. The second interconnect structure can include a portion of the test structure and various interconnections between the second substrate and the first substrate, or additional terminals.

At operation 715, the first interconnect structure is electrically coupled (e.g., electrically connected) to the second interconnect structure. For example, the first substrate and the second substrate can be bonded via the respective interconnect structures (e.g., as described with reference to operation 620 of FIG. 6). The interconnection can be a die or wafer interconnection, and can include misalignment of one or more portions of the semiconductor device. The misalignment can be caused by interlayer misalignments, or non-planarity or other feature or positon of one or more substrates.

At operation 720, an impedance of a plurality of test structures is measured. For example, the impedance can be measured at a DC state, or at various frequencies. The impedance can be indicative of open circuits, closed circuits, or a shape or surface area of connection between the first interconnect structure and the second interconnect structure. For example, a plurality of alignment charts can be generated for various regions of the semiconductor device. The impedance measurements can be relative or absolute. For example, an absolute impedance can be measured, or a relative difference between various test structures can be measured. For example, an impedance can be normalized to a wafer, die, or portion thereof, such as an individual test structure.

At operation 725, the impedances are compared to one or more predefined thresholds. For example, a first threshold can be indicative of an open circuit. A second threshold can be indicative of a marginal connection. A third threshold can be indicative of a low impedance connection. The thresholds can be static or normalized based on a wafer, die, or region thereof, such as an individual test structure. For example, a plurality of test structures can be via chains having a plurality of offset or potentially offset connections. The conductivity can be normalized to a number of connections. For example, a first threshold for a test structure having a via chain with 100 connections can be 100; the first threshold for a test structure having a via chain with 50 connections can be 50. In some embodiments, the normalization can be nonlinear, such as to account for an impedance of the probe pads, or can be proportional between various test structures.

At operation 730, a performance of semiconductor device circuits are predicted based on the comparison. For example, a circuit disposed on the first substrate or the second substrate can include connections therebetween or otherwise include interconnections interfacing between the first interconnect structure and the second interconnect structure. A misalignment between the first interconnect structure and the second interconnect structure can be inferred based on the misalignment of the test structures. For example, a semiconductor device can be determined to be inoperable based on a misalignment exceeding an operability threshold. A semiconductor device can be determined to be at risk of inoperability based on the misalignment exceeding a risk threshold. A semiconductor device can be determined to be operable at reduced performance based on a misalignment exceeding one or more performance thresholds.

Various actions can be taken based on the misalignment data. For example, inoperable parts can be discarded, at risk parts can be discarded or selectively used (e.g., in low risk applications, such as devices including few semiconductor devices). Reduced performance devices can be operated at reduced performance. For example, the first and second substrate can include a processor or memory device, which can be operated at a lower frequency. High performance devices can be selectively used in high performance or high reliability applications. Misalignment data can be used for process optimizations. For example, if a semiconductor device is frequently misaligned in a first direction, the root cause may be investigated or the interconnect structure can be intentionally offset in a direction opposite the first direction to negate the misalignment.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device comprising:
a first semiconductor substrate;
a second semiconductor substrate;
a plurality of first conductive structures connected to the first semiconductor substrate;
a plurality of second conductive structures connected to the second semiconductor substrate;
a plurality of first via structures connecting the plurality of first conductive structures to a plurality of third conductive structures;

a plurality of second via structures connecting the second conductive structures to a plurality of fourth conductive structures; and a test structure of the plurality of first via structures, the plurality of second via structures, the plurality of third conductive structures, or the plurality of fourth conductive structures, wherein at least some of the plurality of first via structures, the plurality of second via structures, the plurality of third conductive structures, or the plurality of fourth conductive structures are intentionally offset from a plurality of respective aligned positions.

2. The semiconductor device of claim 1, wherein the first semiconductor substrate is a wafer.

3. The semiconductor device of claim 1, wherein the first semiconductor substrate is a die.

4. The semiconductor device of claim 1, wherein:
the first semiconductor substrate comprises a first active surface comprising one or more first circuits disposed thereupon;
the second semiconductor substrate comprises a second active surface comprising one or more second circuits disposed thereupon;
the first active surface faces the second active surface; and
the first active surface and the second active surface are electrically interconnected.

5. The semiconductor device of claim 1, comprising:
a plurality of intentionally offset third conductive structures, comprising:
a first portion of the intentionally offset third conductive structures are offset a first distance in a first direction;
a second portion of the intentionally offset third conductive structures are offset a second distance in the first direction, wherein the second distance is greater than the first distance;
a third portion of the intentionally offset third conductive structures are offset a third distance in a second direction, wherein the second direction is perpendicular to the first direction; and
a fourth portion of the intentionally offset third conductive structures are offset a fourth distance in the second direction.

6. The semiconductor device of claim 5, wherein the third distance is equal to the first distance, and the forth distance is equal to the second distance.

7. The semiconductor device of claim 1, wherein each test structure comprises a plurality of conductive pads to measure an impedance of the test structure.

8. A method for fabricating a semiconductor device comprising:
forming a plurality of first conductive structures over a first semiconductor substrate;
forming a plurality of second conductive structures over a second semiconductor substrate;
forming a plurality of first via structures over the first conductive structures;
forming a plurality of second via structures over the second conductive structures;
forming a plurality of third conductive structures over the first via structures, wherein at least some of the third conductive structures are offset from a plurality of respective aligned positions; and
electrically coupling the third conductive structures to the second via structures.

9. The method of claim 8, comprising:
forming a plurality of fourth conductive structures over the second via structures wherein the plurality of fourth conductive structures are offset from the respective aligned positions.

10. The method of claim 8, wherein:
a first portion of the third conductive structures are intentionally offset a first distance in a first direction;
a second portion of the third conductive structures are intentionally offset a second distance in the first direction; and
a third portion of the third conductive structures are not intentionally offset.

11. The method of claim 10, wherein the second distance is greater than the first distance.

12. The method of claim 8, wherein electrically coupling the third conductive structures to the plurality of the second via structures comprises one or more intermediate structures.

13. A method for determining an alignment of one or more semiconductor substrates comprising:
forming a first interconnect structure comprising one or more intentionally offset portions over a first semiconductor substrate;
forming a second interconnect structure over a second semiconductor substrate;
electrically coupling the second interconnect structure to the first interconnect structure to form a semiconductor device interconnect structure, wherein the semiconductor device interconnect structure comprises one or more test structures;
measuring an impedance of the one or more test structures via conductive pads;
comparing the impedance to one or more predefined impedance thresholds; and
predicting a performance of one or more circuits of the first semiconductor substrate or the second semiconductor substrate based on the comparison of the impedance to the one or more predefined impedance thresholds.

14. The method of claim 13, wherein the conductive pads are electrically connected to a via structure extending through an opening in the first semiconductor substrate or the second semiconductor substrate.

15. The method of claim 13, wherein the second interconnect structure is joined to the first interconnect structure by an intermediate interconnect structure.

16. The method of claim 13, further comprising:
associating the impedance of the one or more test structures with an alignment mark;
wherein the first semiconductor substrate comprises a first portion of the alignment mark;
wherein the second semiconductor substrate comprises a second portion of the alignment mark; and
wherein the alignment mark is configured for use with a vision system.

17. The method of claim 16, wherein the vision system is an infrared system to detect the first portion of the alignment mark through the second semiconductor substrate or the second portion of the alignment mark through the first semiconductor substrate.

18. The method of claim 13, wherein:
the test structures comprise a plurality of via structures connected by a plurality of conductive structures;
the impedance of the test structures is determined based on a first one of the conductive pads and a second one of the conductive pads; and the impedance of the test structures, prior to electrically coupling the second interconnect structure to the first interconnect structure, are indicative of an open circuit.

19. The method of claim 18, wherein the first one of the conductive pads and the second one of the conductive pads are both comprised within one of the first interconnect structure or the second interconnect structure.

20. The method of claim 13, wherein the impedance of the test structures is a resistance of the test structures.

* * * * *